(12) United States Patent
Cheng et al.

(10) Patent No.: US 9,721,845 B1
(45) Date of Patent: Aug. 1, 2017

(54) VERTICAL FIELD EFFECT TRANSISTORS WITH BOTTOM CONTACT METAL DIRECTLY BENEATH FINS

(71) Applicant: International Business Machines Corporation, Armonk, NY (US)

(72) Inventors: Kangguo Cheng, Schenectady, NY (US); Xin Miao, Guilderland, NY (US); Wenyu Xu, Albany, NY (US); Chen Zhang, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/138,651

(22) Filed: Apr. 26, 2016

(51) Int. Cl.
| | |
|---|---|
| *H01L 21/8234* | (2006.01) |
| *H01L 29/66* | (2006.01) |
| *H01L 29/78* | (2006.01) |
| *H01L 23/535* | (2006.01) |
| *H01L 21/768* | (2006.01) |
| *H01L 27/088* | (2006.01) |

(52) U.S. Cl.
CPC ......... *H01L 21/823487* (2013.01); *H01L 21/76895* (2013.01); *H01L 21/823431* (2013.01); *H01L 21/823475* (2013.01); *H01L 23/535* (2013.01); *H01L 27/0886* (2013.01); *H01L 29/66553* (2013.01); *H01L 29/66666* (2013.01); *H01L 29/66795* (2013.01); *H01L 29/785* (2013.01); *H01L 29/7827* (2013.01)

(58) Field of Classification Search
CPC ..... H01L 21/823431; H01L 21/823475; H01L 21/823487; H01L 21/76895; H01L 23/535; H01L 27/0886; H01L 29/66553; H01L 29/66666; H01L 29/66795; H01L 29/7827; H01L 29/785
See application file for complete search history.

(56) References Cited

U.S. PATENT DOCUMENTS

| | | | |
|---|---|---|---|
| 6,156,611 | A | 12/2000 | Lan et al. |
| 6,579,759 | B1 | 6/2003 | Chudzik et al. |
| 7,230,286 | B2 | 6/2007 | Cohen et al. |
| 7,446,025 | B2 | 11/2008 | Cohen et al. |
| 7,524,725 | B2 | 4/2009 | Chung |
| 7,683,428 | B2 | 3/2010 | Chidambarrao et al. |
| 7,749,905 | B2 | 7/2010 | Cohen et al. |

(Continued)

*Primary Examiner* — Christine Enad
(74) *Attorney, Agent, or Firm* — Fleit Gibbons Gutman Bongini Bianco PL; Thomas S. Grzesik

(57) ABSTRACT

Various embodiments disclose a method for fabricating one or more vertical fin field-effect-transistors. In one embodiment, a structure is formed. The structure comprises a substrate, a source/drain layer, and a plurality of fins formed on the first source/drain layer. The source/drain layer comprises a first semiconductor layer, a sacrificial layer, and a second semiconductor layer. A bottom spacer layer is formed in contact with the second semiconductor layer and the plurality of fins. A gate structure is then formed. A dielectric layer is deposited in contact with at least the gate structure, the bottom spacer layer, and the second semiconductor layer. At least a portion of the dielectric layer and a portion of the second semiconductor are removed. This removal forms a trench exposing a portion of the sacrificial layer. The sacrificial layer is then removed forming a cavity. A contact material is deposited within the trench and the cavity.

20 Claims, 14 Drawing Sheets

(56) References Cited

U.S. PATENT DOCUMENTS

| | | | |
|---|---|---|---|
| 7,767,503 B2 * | 8/2010 | Zhu | H01L 29/0653 257/E21.54 |
| 7,994,568 B2 | 8/2011 | Chung | |
| 8,207,032 B2 | 6/2012 | Fischer et al. | |
| 8,409,948 B2 | 4/2013 | Fischer et al. | |
| 8,637,849 B2 | 1/2014 | Deligianni et al. | |
| 8,981,463 B2 | 3/2015 | Sandhu | |
| 9,443,976 B1 * | 9/2016 | Xie | H01L 27/0886 |
| 2012/0175727 A1 * | 7/2012 | Lin | H01L 21/743 257/508 |
| 2013/0285138 A1 * | 10/2013 | Vega | H01L 29/7391 257/330 |
| 2013/0320431 A1 * | 12/2013 | Su | H01L 21/82348 257/329 |
| 2015/0311344 A1 * | 10/2015 | Wu | H01L 29/78648 257/72 |
| 2016/0240534 A1 * | 8/2016 | Murthy | H01L 21/26506 |

\* cited by examiner

VERTICAL FIELD EFFECT TRANSISTORS WITH BOTTOM CONTACT METAL DIRECTLY BENEATH FINS

BACKGROUND OF THE INVENTION

The present disclosure generally relates to the field of semiconductors, and more particularly relates to vertical field-effect-transistors having bottom contact metal directly beneath fins.

Vertical transistors are a promising option for technology scaling for 5 nm and beyond. However, for bottom contacts in these transistors the current generally needs to travel laterally in silicon before reaching the fins, which can be problematic for reducing series resistance.

SUMMARY OF THE INVENTION

In one embodiment, a method for fabricating a vertical fin field-effect-transistor is disclosed. The method comprises forming a structure. The structure comprises a substrate, a source/drain layer, and a plurality of fins formed on the first source/drain layer. The source/drain layer comprises a first semiconductor layer, a sacrificial layer, and a second semiconductor layer. A bottom spacer layer is formed in contact with the second semiconductor layer and the plurality of fins. A gate structure is formed in contact with the plurality of fins and the bottom spacer layer. A dielectric layer is deposited in contact with at least the gate structure, the bottom spacer layer, and the second semiconductor layer. At least a portion of the dielectric layer adjacent to the gate structure and a portion of the second semiconductor are removed. This removal forms a trench exposing a portion of the sacrificial layer. After the trench has been formed, the sacrificial layer is removed. Removal of the sacrificial layer forms a cavity between the first semiconductor layer and the second semiconductor layer adjacent to and under the gate structure. A contact material is deposited within the trench and the cavity.

In another embodiment, a vertical fin field-effect-transistor is disclosed. The vertical field-effect-transistor comprises a substrate and a first source/drain layer. The first source/drain layer comprises a first semiconductor layer and a second semiconductor layer. A plurality of fins are each formed on and in contact with the second semiconductor layer. A gate structure is formed in contact with the plurality of fins. A second source/drain layer is formed on the gate structure. A contact comprises a vertical portion formed adjacent to the gate structure and a horizontal portion formed between the first and second semiconductor layers and at least under the gate structure.

In yet another embodiment, an integrated circuit is disclosed. The integrated circuit comprises a vertical fin field-effect-transistor. The vertical field-effect-transistor comprises a substrate and a first source/drain layer. The first source/drain layer comprises a first semiconductor layer and a second semiconductor layer. A plurality of fins are each formed on and in contact with the second semiconductor layer. A gate structure is formed in contact with the plurality of fins. A second source/drain layer is formed on the gate structure. A contact comprises a vertical portion formed adjacent to the gate structure and a horizontal portion formed between the first and second semiconductor layers and at least under the gate structure.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which.

DETAILED DESCRIPTION

Figure 1:
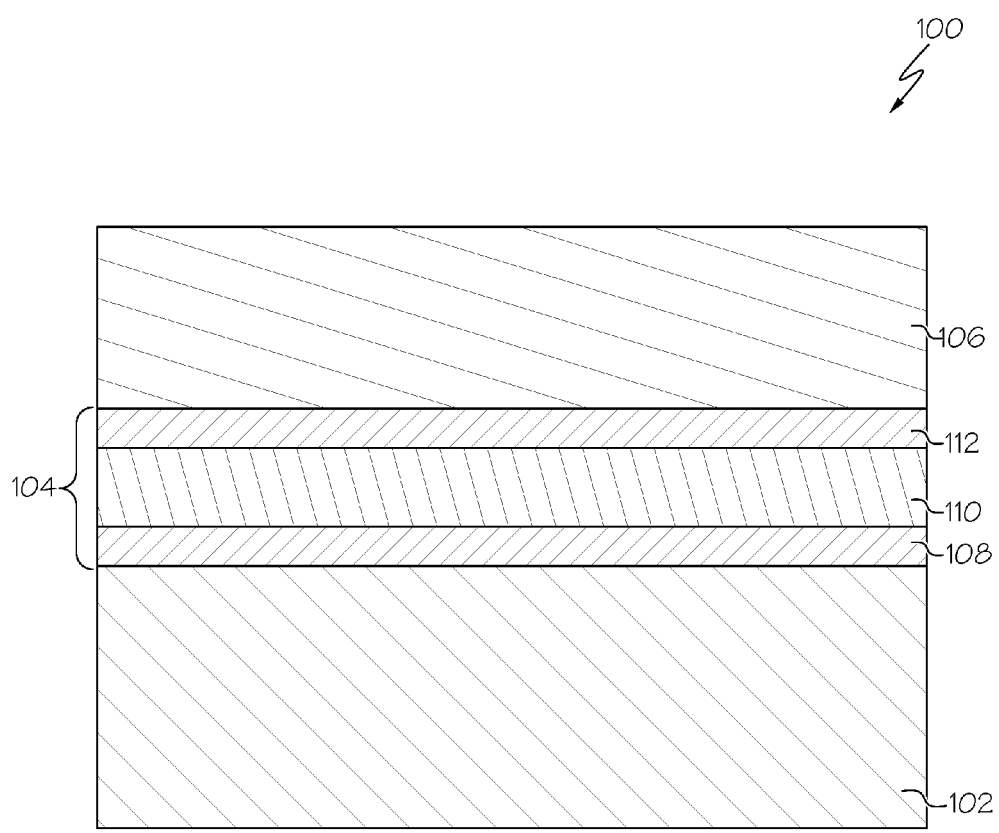
FIG. 1 is a cross-sectional view of an initial semiconductor structure according to one embodiment of the present disclosure.

It is to be understood that the present disclosure will be described in terms of a given illustrative architecture; however, other architectures, structures, substrate materials and process features and steps may be varied within the scope of the present disclosure.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Referring now to the drawings in which like numerals represent the same of similar elements, FIGS. 1-13 illustrate various processes for fabricating vertical field-effect-transistors (FETs) with bottom contact metal directly beneath fins. FIG. 1 shows a substrate a partial semiconductor structure/device 100 comprising a substrate, a bottom source/drain layer 104, and a channel layer 106. The substrate 102 can be single crystalline and or a bulk substrate, a semiconductor-on-insulator (SOI) substrate, or a hybrid substrate. An insulator layer (not shown) comprising a dielectric material such as silicon oxide, silicon nitride, silicon oxynitride, or any combination thereof can be formed on an in contact with the substrate 102. The thickness of the substrate 102 can be, for example, from 50 microns to 1,000 microns, although lesser and greater thicknesses can be employed as well.

The substrate 102 can be appropriately doped either with p-type dopant atoms and/or with n-type dopant atoms, or the material can be substantially undoped (intrinsic). The dopant concentration of the substrate 102 can be from $1.0 \times 10^{15}/cm^3$ to $1.0 \times 10^{19}/cm^3$, and in one embodiment, is from $1.0 \times 10^{16}$ $cm^3$ to $3.0 \times 10^{18}/cm^3$, although lesser and greater dopant concentrations are applicable as well. An optional counter-doped layer (not shown) can be formed on and in contact with the substrate 102 (or buried insulator layer if formed). The counter-doped layer, in one embodiment, is formed by an epitaxial growth of a semiconductor material. The counter-doped layer may be implanted with dopants and annealed using, for example, rapid thermal anneal. Alternatively, the counter-doped layer can be doped in-situ during the epitaxial growth. The purpose of the counter-doped layer is to provide isolation between one transistor and the next transistor.

FIG. 1 further shows that, in one embodiment, the bottom source/drain layer 104 is formed on and in contact with the substrate 102 (or counter-doped layer if formed). The bottom source/drain layer 104 can be, for example, an n++ doped region or a p++ doped region of the substrate 102 and can have a thickness in a range of, for example, about 10 nm to about 200 nm. However, other thicknesses are applicable as well. The bottom source/drain region 104, in this embodiment, comprises multiple layers each formed by epitaxial growth. For example, a first doped (n++ or p++) silicon layer 108 is formed on and in contact with the substrate 102. A sacrificial layer 110 is then formed on and in contact with the first silicon layer 108. In one embodiment, the sacrificial layer 110 comprises silicon germanium (SiGe). A second doped (n++ or p++) silicon layer 112 is then formed on and in contact with the sacrificial layer 110. It should be noted that in embodiments where the substrate is a silicon-on-insulator (SOI) substrate, the sacrificial SiGe layer is not needed. For example, an SOI substrate comprises a handle substrate (e.g., a silicon substrate), an overlying insulator layer (e.g., an oxide layer), and an overlying semiconductor layer (e.g., a silicon layer). In this embodiment, the insulator layer acts as the sacrificial layer.

The channel layer 106 is formed on and in contact with the second silicon layer 108 of the bottom source/drain layer 104. The channel layer 106 comprises a channel material that can be undoped or doped with either p-type or n-type dopants through ion implantation, plasma doping, or gas phase doping. P-type transistors are produced by doping the channel material with elements from group III of the periodic table (e.g., boron, aluminum, gallium, or indium). As an example, the dopant can be boron in a concentration ranging from 1×10E17 atoms/cm3 to 1×10E22 atoms/cm3. N-type transistors are produced by doping the channel material with elements from group V of the periodic table (e.g., phosphorus, antimony, or arsenic). As an example, the dopant can be phosphorus in a concentration ranging from 1×10E14 atoms/cm3 to 1×10E20 atoms/cm3. The channel layer 106 may be formed by epitaxial growth.

The terms "epitaxial growth", "epitaxial deposition", "epitaxially formed", epitaxially grown", and their variants and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatuses that are suitable for use in forming the multi-layer bottom source/drain region 104 include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). A number of different sources may be used for the deposition of the various layers 108, 110, 112 for the bottom source/drain layer 104. For example, the gas source for the deposition of epitaxial semiconductor material may include a silicon containing gas source, a germanium containing gas source, or a combination thereof. Examples of silicon containing gas sources are silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium containing gas sources are germane, digermane, halogermane, dichlorogermane, trichlorogermane, tetrachlorogermane and combinations thereof. While an epitaxial silicon germanium alloy fin can be formed utilizing a combination of such gas sources. Carrier gases like hydrogen, nitrogen, helium and argon can be used.

Figure 2:
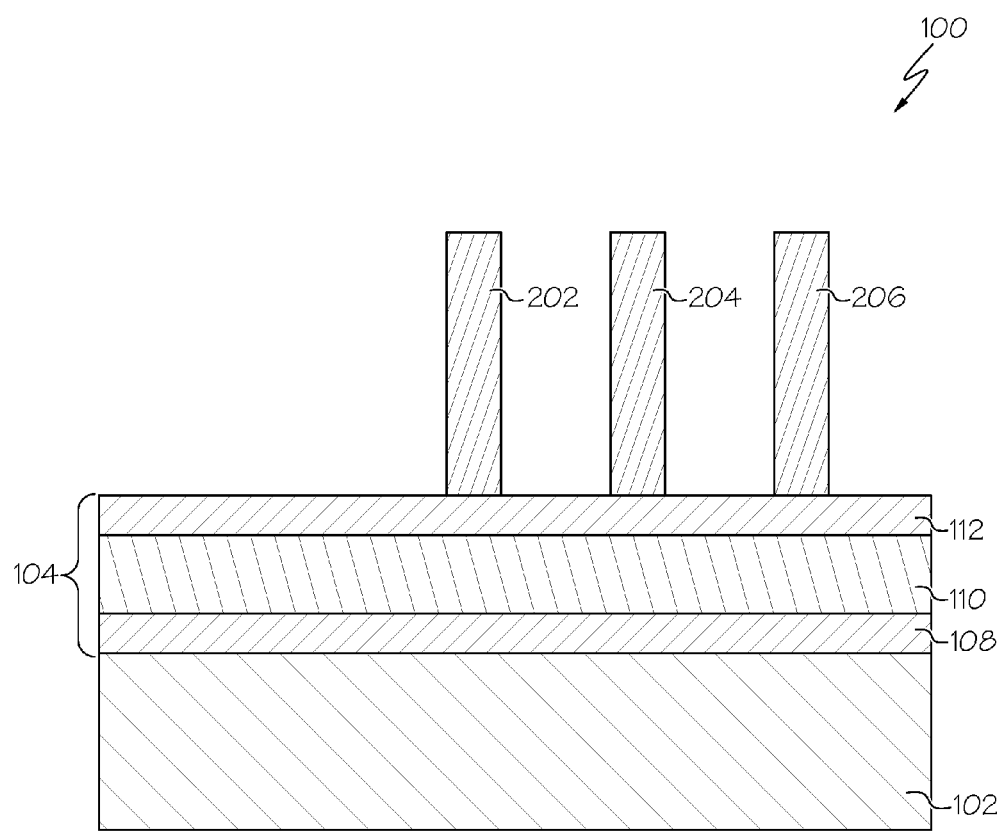
FIG. 2 is a cross-sectional view of the semiconductor structure after fin structures have been formed according to one embodiment of the present disclosure.

FIG. 2 shows the semiconductor device 100 after fin structures 202, 204, 206, have been formed in the channel layer 106. The fins 202, 204, 206, are formed, in one embodiment, by forming an etch-stop capping layer onto the channel material through, for example, deposition. The etch-stop capping layer, in one embodiment, may be made of silicon-nitride although other material suitable in providing etch-stop function may be used as well. One or more fin structures 202, 204, 206, are subsequently formed or etched out of the channel material to be on top of and in contact with the second silicon layer 108 of the source/drain layer 104 through a process involving masking, using industry-standard lithographic techniques, and directionally etching the etch-stop capping layer and underneath channel material. The directional etching process, for example a reactive-ion-etching (RIE) process, stops on the source/drain layer 104. In one embodiment, the fins have a thickness of, for example, 20 nm to 100 nm. After the RIE etching process, the photo-resist mask used in the lithographic etching process can be removed. The etch-stop capping layer can also be removed as well.

Figure 3:
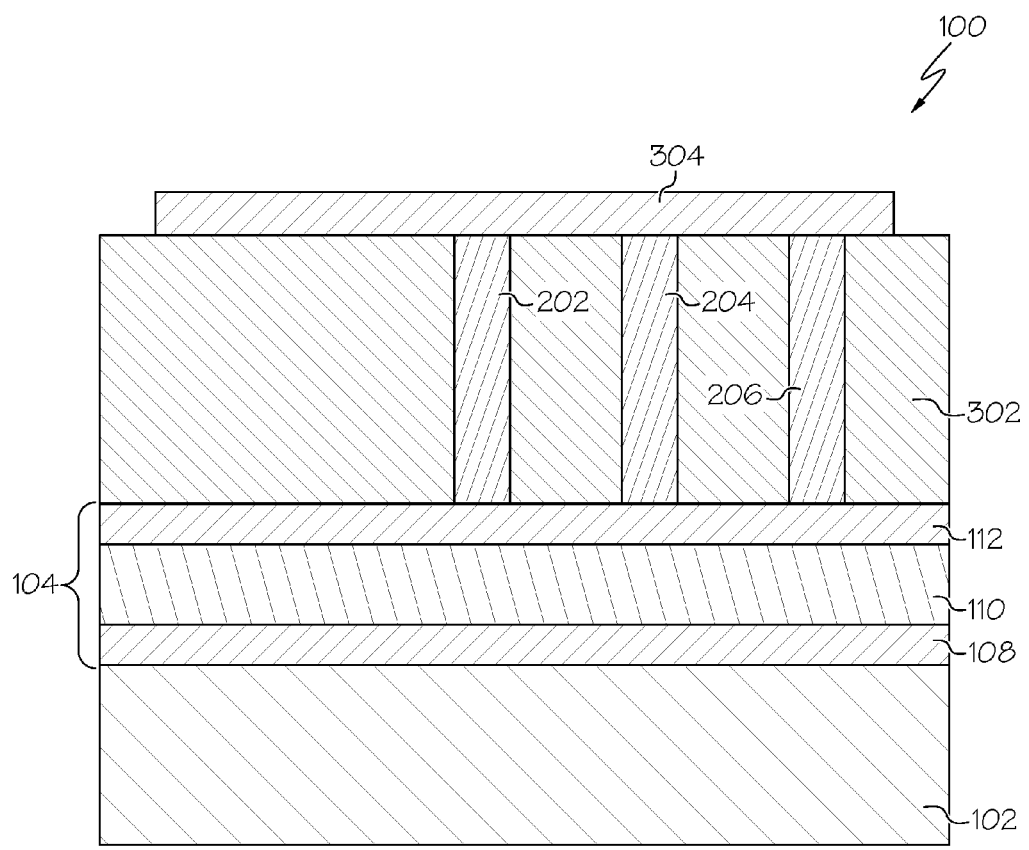
FIG. 3 is a cross-sectional view of the semiconductor structure after an oxide layer and hard masks have been formed according to one embodiment of the present disclosure.
Figure 4:
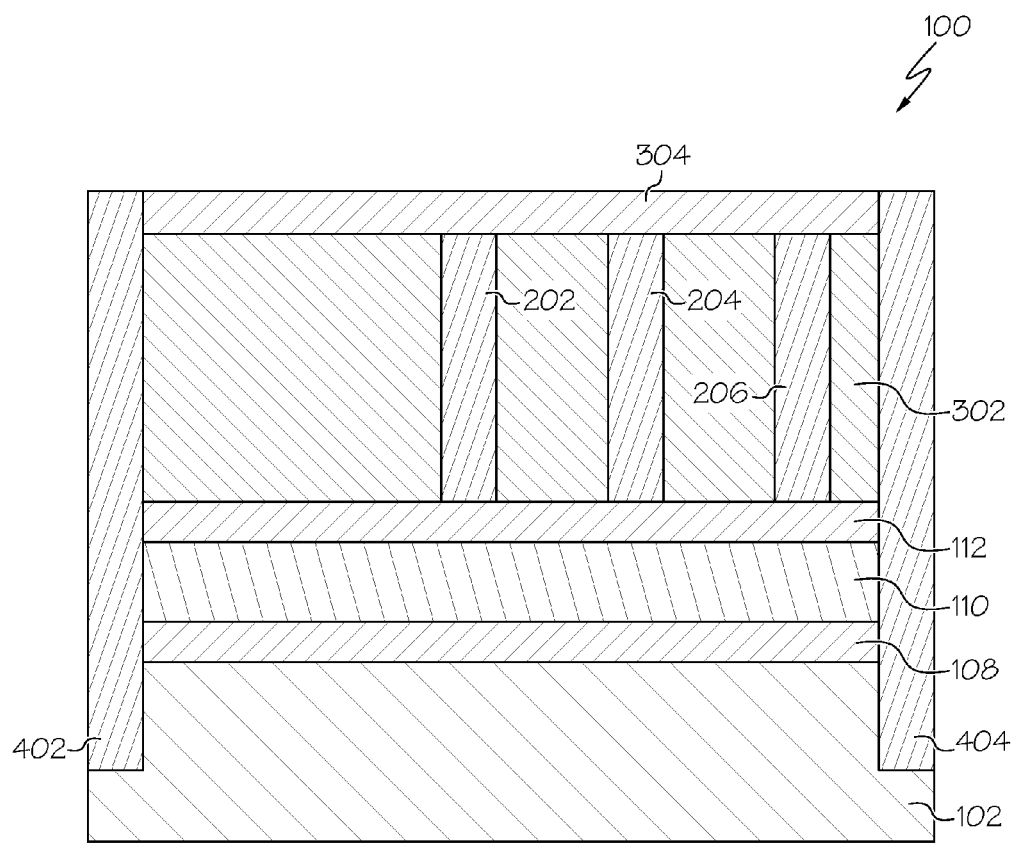
FIG. 4 is a cross-sectional view of the semiconductor structure after exposed portions of the structure have been etched and isolation oxide has been deposited according to one embodiment of the present disclosure.
Figure 5:
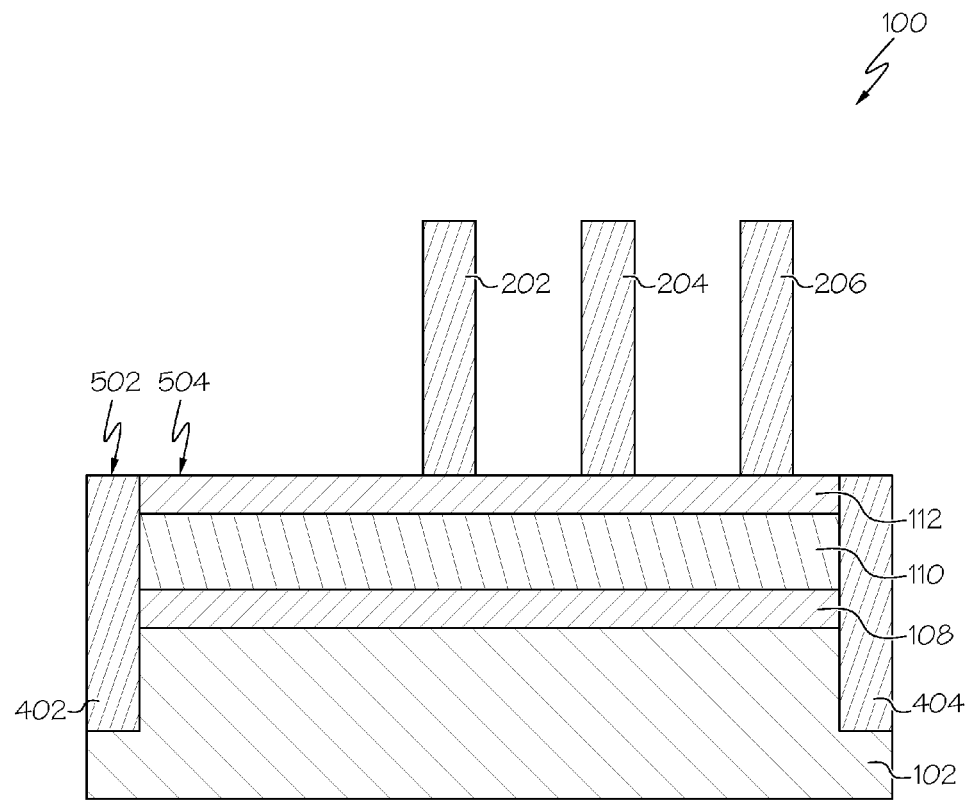
FIG. 5 is a cross-sectional view of the semiconductor structure after isolation regions have been formed according to one embodiment of the present disclosure.

After the fins 202, 204, 206 are formed, a flowable oxide 302 is deposited over the structure 100 as shown in FIG. 3. FIG. 3 also shows that a hard mask 304 is formed over the structure 100 leaving exposed portions where shallow trench isolation (STI) regions are to be formed. The hard mask 304 can be formed by, for example, depositing, and a suitable hard mask material, such as silicon nitride, onto the flowable oxide 302 and then patterned using standard lithography and etching techniques. Trenches are then formed within the exposed oxide 302 down into the substrate 102. Shallow trench isolation (STI) oxide is then deposited within the trench regions forming STI regions 402, 404, as shown in FIG. 4. The flowable oxide 302, mask 304, and excess STI oxide are removed via chemical-mechanical polishing (CMP), selective etching, and/or the like. FIG. 5 shows that the resulting STI regions 402, 404 comprise a top surface 502 that is co-planar with a top surface 504 of the second silicon layer 112 of the bottom source/drain layer 104.

Figure 6:
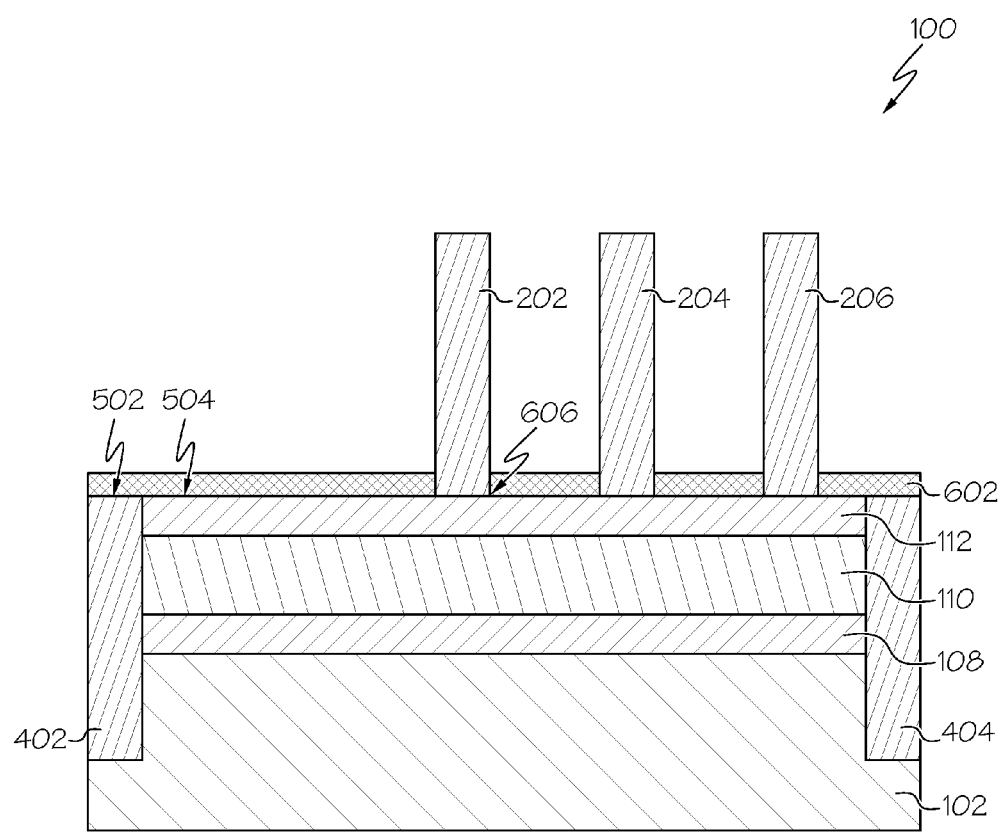
FIG. 6 is a cross-sectional view of the semiconductor structure after a bottom spacer layer has been formed according to one embodiment of the present disclosure.

A bottom spacer layer 602 is formed in contact with each of the fin 202, 204, 206, as shown in FIG. 6. The bottom spacer 602 contacts the top surface 502 of STI regions 402, 404 and the top surface 504 of the bottom source/drain layer 104. The spacer 602 also contacts a portion of the sidewalls 606 of each fin 202, 204, 206. In one embodiment, the bottom spacer 602 comprises an insulating material (such as silicon oxide, silicon nitride, silicon oxynitride, or a combination of these) and can be formed using any conventional deposition process such as, for example, chemical vapor deposition (CVD) and subsequent etching techniques. The deposited spacer material is then subsequently etched to form the final spacer structures. In one embodiment, the spacers have a thickness of, for example, 3 nm to 30 nm.

Figure 7:
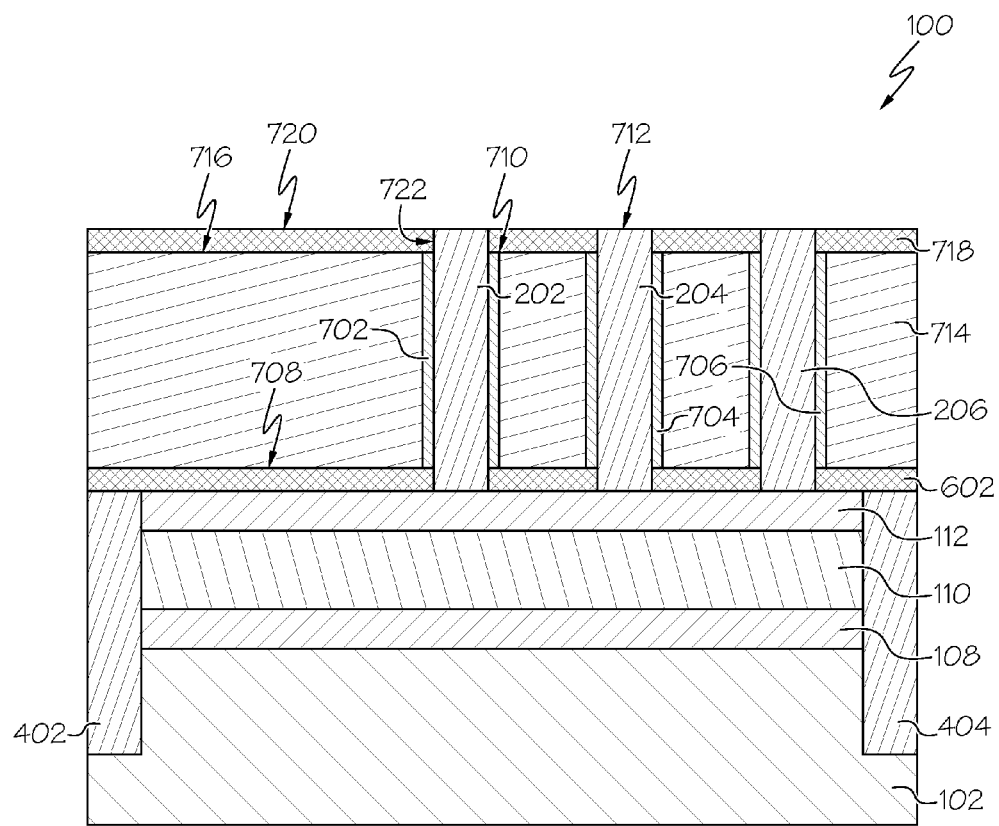
FIG. 7 is a cross-sectional view of the semiconductor structure after a gate structure and top spacer layer have been formed according to one embodiment of the present disclosure.

A high-k dielectric material is then blanket deposited over the entire structure 100, for example by CVD (chemical vapor deposition), PECVD (plasma enhanced chemical vapor deposition), or ALD (Atomic layer deposition). Excessive high-k gate dielectric material is removed, for example, by polishing such as chemically mechanical polishing (CMP) and/or etching to form high-k gate dielectric layers 702, 704, 706 as shown in FIG. 7. Each of the high-k gate dielectric layers 702, 704, 706 comprise a top surface 710 that is below with a top surface 712 of their fin 202, 204, 206. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k layers 702, 704, 706 may further include dopants such as lanthanum or aluminum.

In one embodiment, the high-k layers 702, 704, 706 are part of a layer comprising a work function metal layer (not shown). In one embodiment, the work function metal layers are formed after and conformal to the high-k layers 702, 704, 706 employing CVD, sputtering, or plating. The work function metal layers comprise one or more metals having a function suitable to tune the work function of nFETs or pFETs. Exemplary first metals that can be employed in the work function metal layer include, but are not limited to La, Ti, and Ta. The thickness of the work function metal layers can be from 3 nm to 15 nm, although lesser and greater thicknesses can also be employed.

FIG. 7 further shows that a metal gate 714 is formed around the fins 202, 204, 206. For example, a metal gate material can be deposited by atomic layer deposition (ALD) or physical vapor deposition (PVD). In one embodiment, the metal gate 714 is a continuous metal gate that wraps around all the fins 202, 204, 206. The metal gate 714 contacts the outer sidewalls of the high-k gate dielectric layers 702, 704, 706 and top surface 708 of the bottom spacer 602. A top surface 716 of the metal gate 714 is co-planar with the top surface 710 of the high-k dielectric layers 702, 704, 706 and the top surface 712 of the fins 202, 204, 206. In one embodiment, the metal gate 714 comprises, for example, tungsten.

A top spacer layer 718 is then formed on the structure 100. The top spacer layer 718 comprises a top surface 720 that is co-planar with the top surface 712 of the fins 202, 204, 206. The top spacer 718 comprises a bottom surface 720 that contacts the top surface 716 of the metal gate 714, and the top surface 710 of the high-k dielectric layers 702, 704, 706. The top spacer layer 718 also contacts the portion 722 of the fin sidewalls 606 that are above the high-k dielectric layers 702, 704, 706. In one embodiment, the top spacer 718 comprises the same or different material as the bottom spacers 602. For example, the top spacer 718 can comprise an insulating material (such as silicon oxide, silicon nitride, silicon oxynitride, or a combination of these) and can be formed using any conventional deposition process such as, for example, chemical vapor deposition (CVD) and subsequent etching techniques. The deposited spacer material is then subsequently etched to form the final spacer structure.

Figure 8:
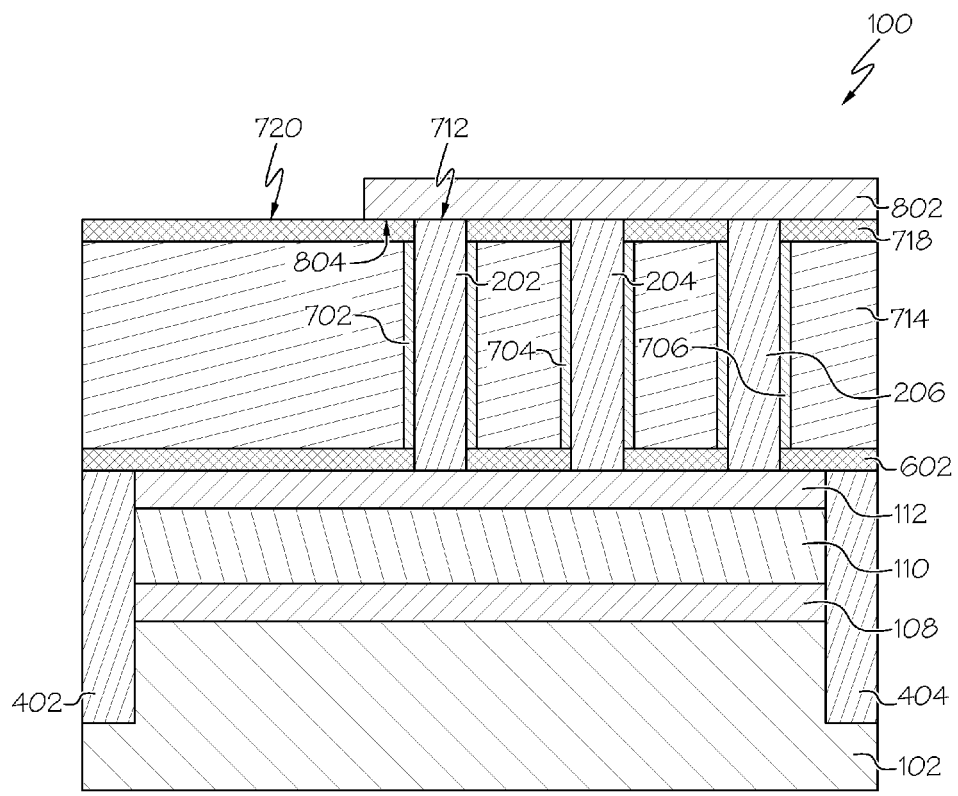
FIG. 8 is a cross-sectional view of the semiconductor structure after a second source/drain layer has been formed according to one embodiment of the present disclosure.

A doped layer 802 (also referred to herein as "top source/drain layer 802") is then formed using an epitaxy process, as shown in FIG. 8. The top source/drain 802 is formed on and in contact with each the fins 202, 204, 206 and the top spacer layer 718. A bottom surface 804 of the top source/drain layer 802 contacts the top surface 712 of the fins 202, 204, 206 and the top surface 720 of the top spacer 718. The top source/drain layer 802 has a thickness in a range of, for example, about 10 nm to about 200 nm. However, other thicknesses are applicable as well. The top source/drain layer 802 can be formed by epitaxial growth.

Figure 9:
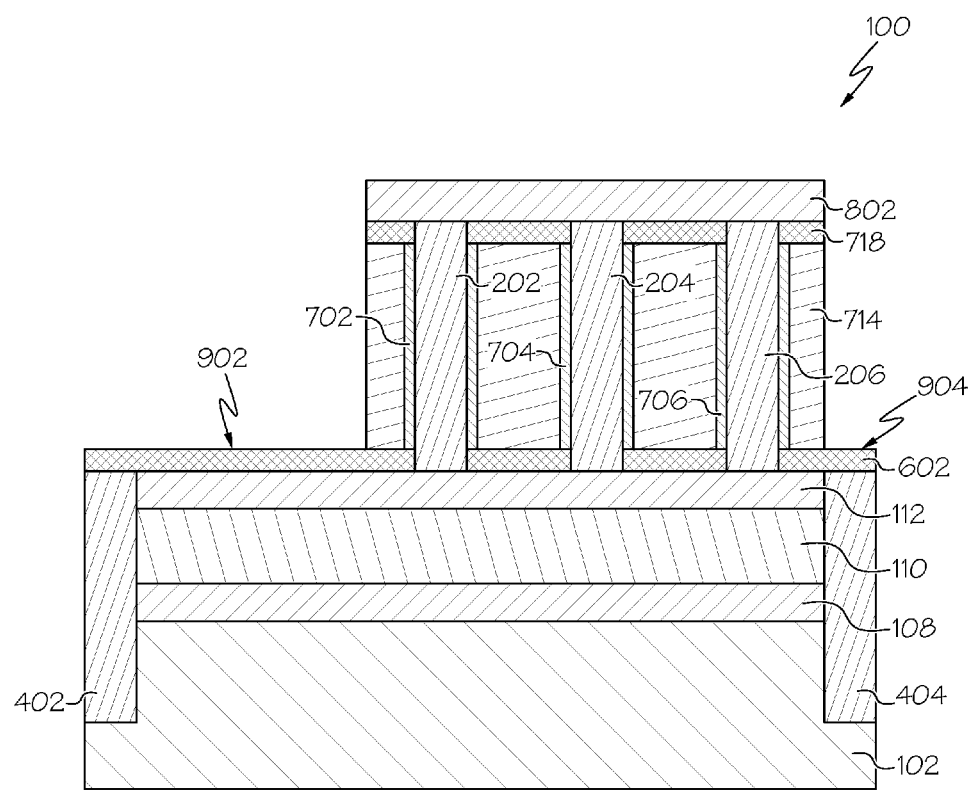
FIG. 9 is a cross-sectional view of the semiconductor structure after a portion of the bottom layer adjacent to the structure layer has been exposed according to one embodiment of the present disclosure.

Portions of the top source/drain layer 802, portions of the top spacer 718, and portions of the metal gate 714 are then selectively removed through a process involving masking, using industry-standard lithographic techniques, and etching. This process exposes portions 902, 904 of the bottom spacer layer 902, as shown in FIG. 9. It should be noted that one or more of the source/drain layer 802, top spacer 718, and metal gate 714 can be etched at different points of the fabrication process discussed above.

Figure 10:
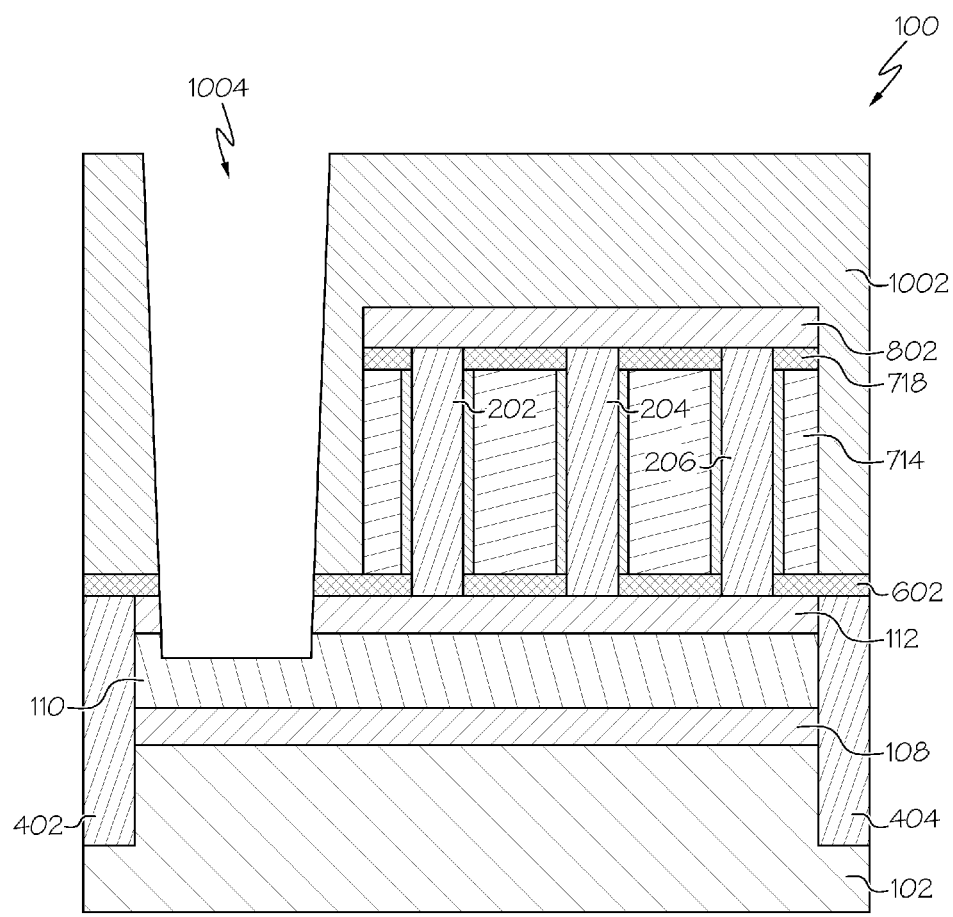
FIG. 10 is a cross-sectional view of the semiconductor structure after a dielectric material has been deposed and a trench has been formed therein according to one embodiment of the present disclosure.

A layer of dielectric material 1002 can be blanket deposited atop the entire structure 100, as shown in FIG. 10. The blanket dielectric may be a silicon-based material, such as SiO2, Si3N4, SiOxNy, SiC, SiCO, SiCOH, and SiCH compounds; the above-mentioned silicon-based materials with some or all of the Si replaced by Ge; carbon-doped oxides; inorganic oxides; inorganic polymers; hybrid polymers; organic polymers such as polyamides or SiLK™; other carbon-based materials; organo-inorganic materials such as spin-on glasses and silsesquioxane-based materials; and diamond-like carbon (DLC, also known as amorphous hydrogenated carbon, α-C:H). Additional choices for the blanket dielectric include any of the aforementioned materials in porous form, or in a form that changes during processing to or from being porous and/or permeable to being non-porous and/or non-permeable.

The deposited dielectric 1002 is then patterned and etched to form a first via/trench 1004 down into to the sacrificial SiGe layer 110 of the bottom source/drain layer 104. For example, the etching processes etches through a portion of the dielectric 1002, a portion of the bottom source/drain layer 104, and a portion of the second Si layer 112, which are adjacent to the fins 202, 204, 206 and gate structure, and partially down into the sacrificial SiGe layer 110. This process exposes a portion of the sacrificial SiGe layer 110.

Figure 11:
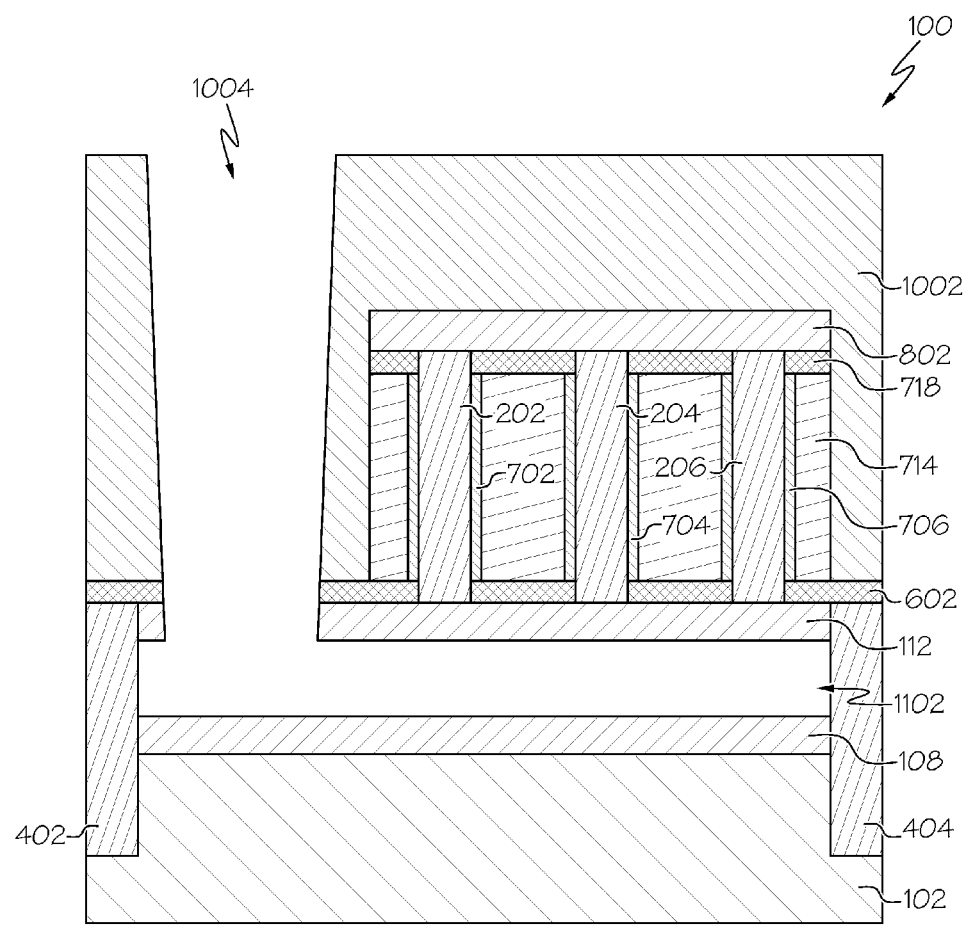
FIG. 11 is a cross-sectional view of the semiconductor structure after a sacrificial layer of a first source/drain layer has been removed forming a cavity between first and second semiconductor layers of the first source/drain layer according to one embodiment of the present disclosure.
Figure 12:
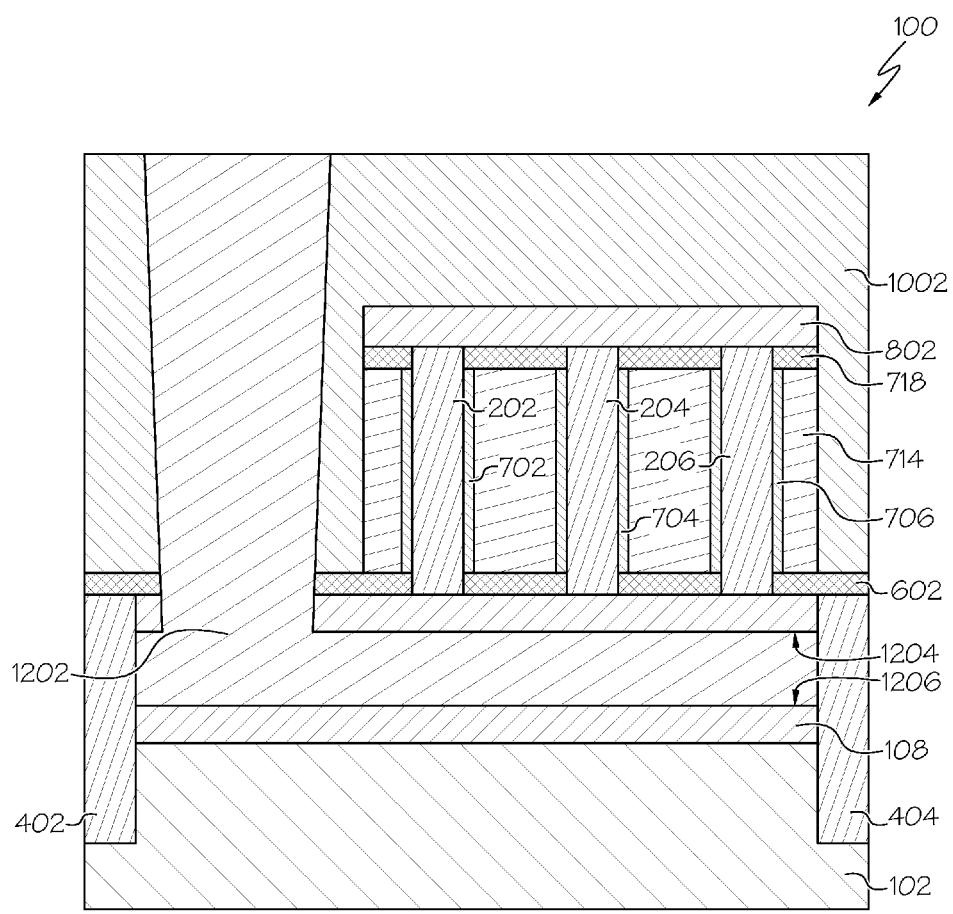
FIG. 12 is a cross-sectional view of the semiconductor structure after contact material has been deposited within the trench and cavity according to one embodiment of the present disclosure.
Figure 13:
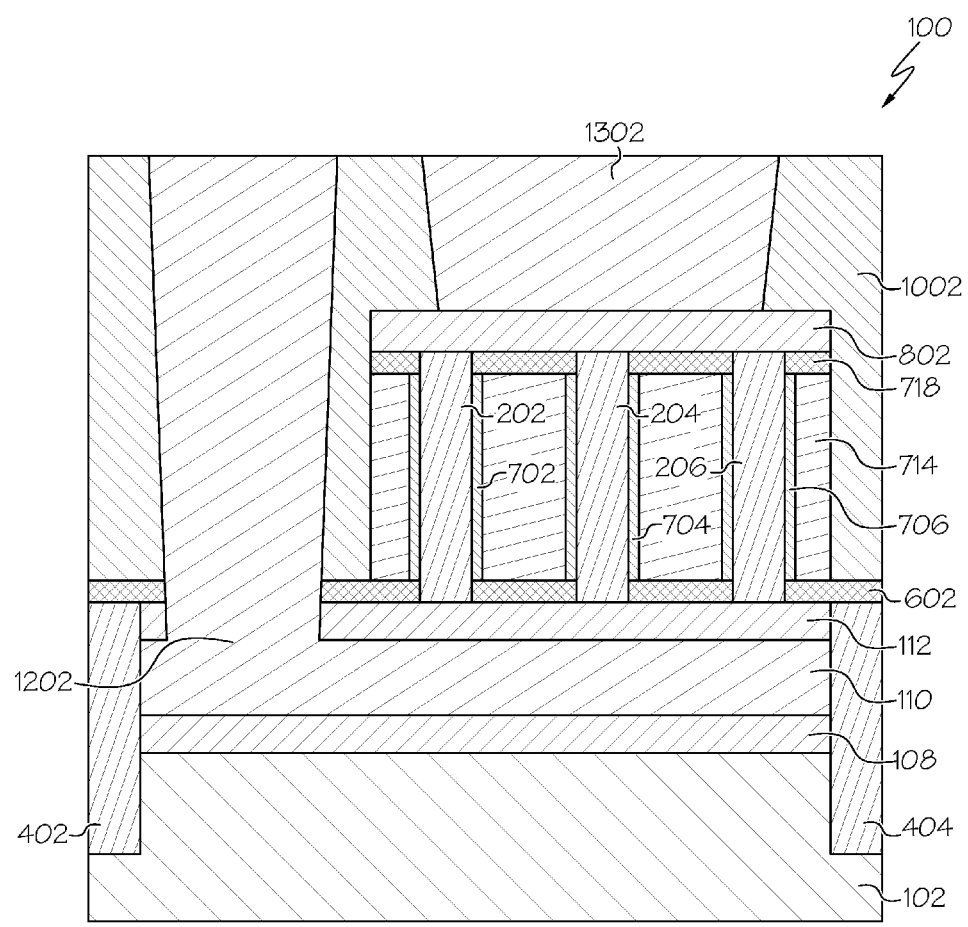
FIG. 13 is a cross-sectional view of the semiconductor structure after a contact has been formed in contact with a portion of the second source/drain layer according to one embodiment of the present disclosure.

The sacrificial SiGe layer 110 is then selectively removed (e.g., via RIE, wet etch, etc.) leaving the first and second Si layers 108, 112 of the bottom source/drain layer 104. For example, FIG. 11 shows that a cavity 1102 is created between the first and second Si layers 108, 112 of the bottom source/drain layer 104 and the STI regions 402, 404. The cavity 1102 extends under/beneath the fins 202, 204, 206 and gate structure. The STI regions 402, 404 (located in and out of the figure) act as fin anchors thereby providing support to the structure after the cavity 1102 is formed. In embodiments where an SOI substrate is utilized, the sacrificial insulator layer is removed as compared to the SiGe layer 110 discussed above.

Conductive material is then deposited to form a contact 1202 within the trench 1004 and cavity 1102. The contact 1202 fills the trench 1004 and cavity 1202 forming a bottom contact. This contact 1202 contacts a bottom surface 1204 of the second Si layer 112, a top surface 1206 of the first Si layer 108, and sidewalls of each of the STI regions 402, 406 and the top surface 1206. The contact 1202 extends under/beneath the fins 202, 204, 206 and gate structure. Therefore, the contact 1202 comprises a vertical portion formed adjacent to the gate structure and a horizontal portion formed between the first and second semiconductor layers 108, 112 and at least under the gate structure. The contact 1202 contacts the silicon directly under the fins 202, 204, 206 thereby enabling current to travel laterally in the metal. This structure also increases the contact area between bottom metal and silicon. The bottom contact 1202 can be formed using a process such as CVD, PVD, ALD, or electroplating processes or some combination of these processes. The conductive metal may include, but is not limited to, tungsten, copper, aluminum, silver, gold and alloys thereof.

A second/top contact 1302 can be formed above the fins 202, 204, 206 and gate structure in contact with the top source/drain layer 718 utilizing a similar process. For example, a trench is formed within the dielectric layer 1002 exposing a portion of the top source/drain layer 718. A conductive material is deposited within the trench to form at least the second/top contact 1302. The second/top contact 1302 can be formed utilizing a process such as CVD, PVD, ALD, or electroplating processes or some combination of these processes, and may include, but is not limited to, tungsten, copper, aluminum, silver, gold and alloys thereof. It should be noted that the bottom contact 1202 and the top contact 1302 can be formed during the same fabrication step or during different fabrication steps.

Figure 14:
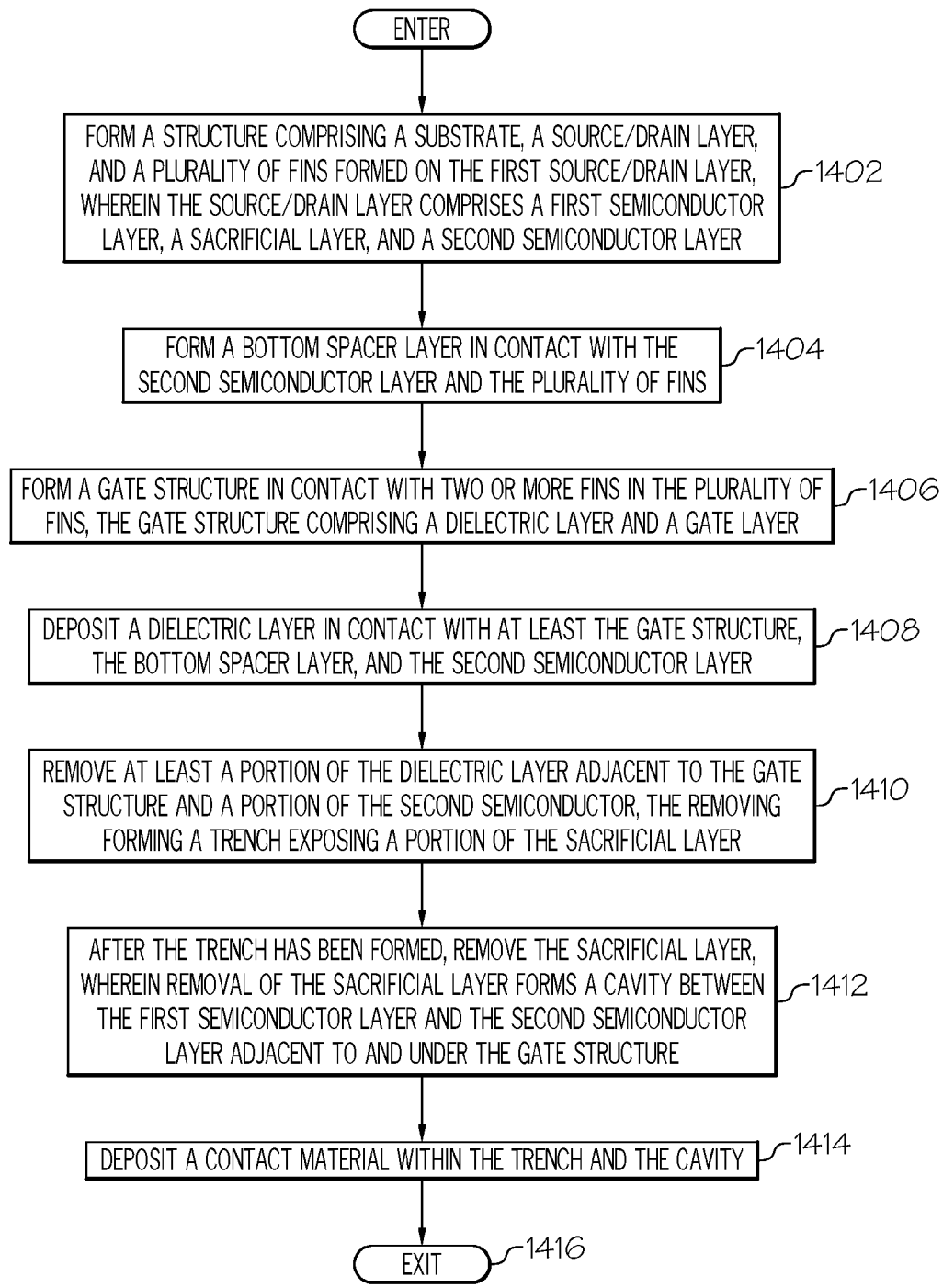
FIG. 14 is an operational flow diagram illustrating one process for fabricating vertical fin field-effect-transistor according to one embodiment of the present disclosure.

FIG. 14 is an operational flow diagram illustrating one process for fabricating a vertical fin field-effect-transistor. It should be noted that each of the steps shown in FIG. 14 has been discussed in greater detail above with respect to FIGS. 1-13. A structure, at step 1402, is formed. The structure comprises a substrate 102, a source/drain layer 104, and a plurality of fins 202, 204, 206 formed on the first source/drain layer 104. The source/drain layer 104 comprises a first semiconductor layer 108, a sacrificial layer 110, and a second semiconductor layer 112. A bottom spacer layer 602, at step 1404, is formed in contact with the second semiconductor layer 112 and the plurality of fins 202, 204, 206.

A gate structure comprising high-k dielectric layers 702, 704, 706 and a gate layer 714, at step 1406, is formed in contact with the plurality of fins 202, 204, 206 and the bottom spacer layer 602. A dielectric layer 1002, at step 1408, is deposited in contact with at least the gate structure, the bottom spacer layer 602, and the second semiconductor layer 112. At least a portion of the dielectric layer 1002 adjacent to the gate structure and a portion of the second semiconductor 112, at step 1410, are removed. This removal process forms a trench 1004 exposing a portion of the sacrificial layer 110. After the trench 1004 has been formed, the sacrificial layer 112, at step 1412, is removed. Removal of the sacrificial layer 110 forms a cavity 1102 between the first semiconductor layer 108 and the second semiconductor layer 112 adjacent to and under the gate structure. A contact material, at step 1414, is deposited within the trench 1004 and the cavity 1102. The control flow then exits at step 1416.

Although specific embodiments of the disclosure have been disclosed, those having ordinary skill in the art will understand that changes can be made to the specific embodiments without departing from the spirit and scope of the disclosure. The scope of the disclosure is not to be restricted, therefore, to the specific embodiments, and it is intended that the appended claims cover any and all such applications, modifications, and embodiments within the scope of the present disclosure.

It should be noted that some features of the present disclosure may be used in one embodiment thereof without use of other features of the present disclosure. As such, the foregoing description should be considered as merely illustrative of the principles, teachings, examples, and exemplary embodiments of the present disclosure, and not a limitation thereof.

Also, these embodiments are only examples of the many advantageous uses of the innovative teachings herein. In general, statements made in the specification of the present application do not necessarily limit any of the various claimed disclosures. Moreover, some statements may apply to some inventive features but not to others.

What is claimed is:

1. A method for fabricating a vertical fin field-effect-transistor, the method comprising:
   forming a structure comprising a substrate, a source/drain layer, and a plurality of fins formed on the first source/drain layer, wherein the source/drain layer comprises a first semiconductor layer, a sacrificial layer, and a second semiconductor layer;
   forming a bottom spacer layer in contact with the second semiconductor layer and the plurality of fins;
   forming a gate structure in contact with the plurality of fins and the bottom spacer layer;
   depositing a dielectric layer in contact with at least the gate structure and the bottom spacer layer;
   removing at least a portion of the dielectric layer adjacent to the gate structure and a portion of the second semiconductor, the removing forming a trench exposing a portion of the sacrificial layer;
   after the trench has been formed, removing the sacrificial layer, wherein removal of the sacrificial layer forms a cavity between the first semiconductor layer and the second semiconductor layer adjacent to and under the gate structure; and
   depositing a contact material within the trench and the cavity.

2. The method of claim 1, wherein forming the structure comprises:
   epitaxially growing the first semiconductor layer on and in contact with the substrate;
   epitaxially growing the sacrificial layer on and in contact with the first semiconductor layer; and
   epitaxially growing the second semiconductor layer on and in contact with the sacrificial layer.

3. The method of claim 1, wherein forming the gate structure comprises:
   forming a separate dielectric layer on and in contact with each fin in the plurality of fins; and
   forming a gate layer in contact with each of the separate dielectric layers.

4. The method of claim 1, further comprising:
   forming a top spacer layer in contact with the gate structure and each fin in the plurality of fins.

5. The method of claim 4, further comprising:
   forming an additional source/drain layer on and in contact with the top spacer layer.

6. The method of claim 5, further comprising:
   removing at least a portion of the dielectric layer above to the gate structure, the removing forming a trench exposing a portion of the top spacer layer.

7. The method of claim 6, further comprising:
   depositing a contact material within the trench.

8. A vertical fin field-effect-transistor comprising at least:
   a substrate;
   a first source/drain layer comprising a first semiconductor layer and a second semiconductor layer;
   a plurality of fins each formed on and in contact with the second semiconductor layer;
   a gate structure in contact with the plurality of fins;
   a second source/drain layer formed on the gate structure; and
   a contact comprising a vertical portion formed adjacent to the gate structure and a horizontal portion formed between the first and second semiconductor layers and at least under the gate structure.

9. The vertical fin field-effect-transistor of claim 8, further comprising:
   a bottom spacer layer in contact with the second semiconductor layers and the plurality of fins.

10. The vertical fin field-effect-transistor of claim 8, further comprising:
    a top spacer layer in contact with the gate structure and the plurality of fins.

11. The vertical fin field-effect-transistor of claim 10, wherein the second source/drain layer is formed on and in contact with the top spacer layer and the plurality of fins.

12. The vertical fin field-effect-transistor of claim 8, wherein the gate structure comprises:
    separate dielectric layers in contact with each fin in the plurality of fins; and
    a gate layer in contact with each of the separate dielectric layers.

13. The vertical fin field-effect-transistor of claim 8, further comprising:
    a contact formed in contact with at least a portion of the second source/drain layer.

14. The vertical fin field-effect-transistor of claim 8, wherein each fin in the plurality of fins comprises a first doped region and a second doped region.

15. An integrated circuit comprising:
    at least one vertical fin field-effect-transistor comprising at least:
      a substrate;
      a first source/drain layer comprising a first semiconductor layer and a second semiconductor layer;
      a plurality of fins each formed on and in contact with the second semiconductor layer;
      a gate structure in contact with the plurality of fins;
      a second source/drain layer formed on the gate structure; and
      a contact comprising a vertical portion formed adjacent to the gate structure and a horizontal portion formed between the first and second semiconductor layers and at least under the gate structure.

16. The integrated circuit of claim 15, wherein the vertical fin field-effect-transistor further comprises:
a bottom spacer layer in contact with the second semiconductor layers and the plurality of fins.

17. The integrated circuit of claim 15, wherein the vertical fin field-effect-transistor further comprises:
a top spacer layer in contact with the gate structure and the plurality of fins.

18. The integrated circuit of claim 17, wherein the second source/drain layer is formed on and in contact with the top spacer layer and the plurality of fins.

19. The integrated circuit of claim 15, wherein the gate structure comprises:
separate dielectric layers in contact with each fin in the plurality of fins; and
a gate layer in contact with each of the separate dielectric layers.

20. The integrated circuit of claim 15, wherein the vertical fin field-effect-transistor further comprises:
a contact formed in contact with at least a portion of the second source/drain layer.

* * * * *